United States Patent
Hahn

(10) Patent No.: US 7,188,327 B2
(45) Date of Patent: Mar. 6, 2007

(54) METHOD AND SYSTEM FOR LOGIC-LEVEL CIRCUIT MODELING

(75) Inventor: Mark Steven Hahn, Milpitas, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 31 days.

(21) Appl. No.: 10/411,634

(22) Filed: Apr. 11, 2003

(65) Prior Publication Data

US 2003/0196182 A1    Oct. 16, 2003

Related U.S. Application Data

(60) Provisional application No. 60/371,696, filed on Apr. 11, 2002.

(51) Int. Cl.
*G06F 17/50* (2006.01)
(52) U.S. Cl. .............................................. 716/6; 716/5
(58) Field of Classification Search .............. 716/4–6
See application file for complete search history.

(56) References Cited

U.S. PATENT DOCUMENTS

| | | | | |
|---|---|---|---|---|
| 5,339,253 A | * | 8/1994 | Carrig et al. | 716/6 |
| 5,394,347 A | * | 2/1995 | Kita et al. | 703/2 |
| 5,404,311 A | * | 4/1995 | Isoda | 716/6 |
| 5,644,498 A | * | 7/1997 | Joly et al. | 716/2 |
| 5,778,216 A | * | 7/1998 | Venkatesh | 713/503 |
| 6,014,510 A | | 1/2000 | Burks et al. | |
| 6,145,117 A | * | 11/2000 | Eng | 716/18 |
| 6,263,483 B1 | * | 7/2001 | Dupenloup | 716/18 |
| 6,308,301 B1 | * | 10/2001 | McBride et al. | 716/4 |
| 6,415,426 B1 | * | 7/2002 | Chang et al. | 716/9 |
| 6,427,226 B1 | * | 7/2002 | Mallick et al. | 716/10 |
| 6,499,129 B1 | * | 12/2002 | Srinivasan et al. | 716/4 |
| 6,591,402 B1 | * | 7/2003 | Chandra et al. | 716/5 |
| 6,591,407 B1 | * | 7/2003 | Kaufman et al. | 716/10 |
| 6,658,635 B1 | * | 12/2003 | Tanimoto | 716/6 |
| 2004/0078767 A1 | * | 4/2004 | Burks et al. | 716/8 |

OTHER PUBLICATIONS

Dunlop, et al., "Managing Complxity in IC Design—Past, Present and Future", Bell Labs Technical Journal. Autumn 1997. pp. 103-125.

"Hierarenical Static Timing Analysis Using Interface Logic Models". Synopsys, Jan. 2001. pp. 1-9.

* cited by examiner

*Primary Examiner*—Jack Chiang
*Assistant Examiner*—Naum B. Levin
(74) *Attorney, Agent, or Firm*—Davidson, Davidson & Kappel, LLC

(57) ABSTRACT

A method for generating a model for a circuit having logic components is provided. The method includes identifying interface path logic components of the logic components so as to define shell logic, and identifying at least one of the logic components on which a constraint has been annotated so as to define constrained logic components. A subset of the logic components to preserve is then determined, the subset including the shell logic and the constrained logic components so as to define preserved logic. The model is then formed from the preserved logic. A highly accurate model can thus be created, while reducing computational and memory requirements. On-the-fly regeneration of the model is also possible, as is dominant path logic preservation.

30 Claims, 4 Drawing Sheets

METHOD AND SYSTEM FOR LOGIC-LEVEL CIRCUIT MODELING

CROSS-REFERENCE TO RELATED APPLICATIONS

The present application claims priority to U.S. Provisional Patent Application No. 60/371,696, filed Apr. 11, 2002 and hereby incorporated by reference herein.

BACKGROUND INFORMATION

The present invention relates to timing analysis for electronic circuits, for example, very large-scale integrated (VSLI) circuits.

Before a circuit design is finalized for fabrication, timing analysis tools are used to verify the proper timing of the circuit. The clock or clocks for the circuit must trigger the various circuit components are proper times. The timing and I/O characteristics of the various basic circuit components, including resistors, transistors and wiring, are known, so that timing diagrams may be created by a circuit designer for very small circuits to ensure that timing is proper.

However, such timing diagrams are impractical for all but the smallest circuits. Thus software tools have been developed to aid circuit designers. These timing analysis tools may be classified as one of two types: static or dynamic. In dynamic timing analysis, the proposed circuit to be created is modeled at the transistor level, and the software, by solving matrix-based equations, determines the timing of the circuit for a test vector. One of the best-known dynamic timing analysis programs is SPICE, developed at the University of California, Berkeley.

Dynamic timing analysis programs that model each transistor have a high level of accuracy, permitting the designer to accurately verify the circuit timing before fabrication. However, for large circuits, dynamic timing analysis is not practical, because the computational power required to process a test vector through the transistor-level model becomes very large.

In response to the computational limitations of dynamic timing analysis programs, static timing analysis (STA) programs have been developed. Although the creation of STA blocks can be time consuming, once they are created, the blocks may be reused for modeling other circuits. Blocks having a known functionality may be used to design large integrated circuits. A library of blocks thus exists that is available to circuit designers, and each of the blocks has known I/O timing characteristics in terms of their interface pins. When the circuit is to be fabricated, an actual transistor-level design is substituted for the block.

The use of STA blocks permits fast and frequent timing checks, even for designs with many millions gates, since timing at the transistor level can be avoided.

However, STA blocks provide only interface timing for a certain clock waveform, for example that a certain block has a minimum time delay and a maximum time delay for a rising edge arriving at a pin 1 of the block and exiting at pin 20 for a certain clock waveform. There is no support for clocks generated within the circuit, and the blocks are often not very accurate, since the worst and best case scenarios may diverge widely.

In response to the limitations of these so-called black-box models, gray box models have been developed that describe the interface timing in terms of a combination of interface pins and internal points within the circuit. These gray box models also lose accuracy compared with dynamic timing analysis and have long characterization times. Moreover, there is no way to apply original constraints to the design when using the gray box model, since the logic of the model is not preserved and thus there is no way to place constraints on the logic into the model.

Clock characterization has also been used to improve the black box model, by providing additional constraints on the clock waveforms provided to the circuit. However, this approach has similar disadvantages to the gray-box models.

A background of timing analysis tools can be found in Dunlap, Evans and Rigge, "Managing Complexity in IC Design—Past Present and Future," Bell Labs Technical Journal, Autumn 1997.

The publication of January 2001 entitled "Hierarchical Static Timing Analysis Using Interface Logic Models" discusses the use of interface logic models which model a circuit based on interface logic.

SUMMARY OF THE INVENTION

Cadence Design Systems, Inc., the present assignee, has developed an approach known as shell-core partitioning described in U.S. Pat. No. 6,622,290, entitled "A TIMING VERIFICATION METHOD EMPLOYING DYNAMIC ABSTRACTION IN CORE/SHELL PARTITIONING" filed Oct. 3, 2000, and hereby incorporated by reference herein. This approach divides a part of a circuit, i.e., a block, to be modeled by dividing the block into interface, i.e. shell, logic and internal, i.e., core, logic. The core logic is generally disregarded, and the shell logic used for modeling the block.

Approaches which preserve only interface logic, while beneficial in that actual logic is preserved, have the disadvantage that there often is no way to apply original constraints when using the model if constrained objects are no longer present. In other words, constraints on core logic cannot be included in the model.

An object of the present invention is to provide a simplified yet accurate model of a logic circuit for use in designing circuits. An alternate or additional object of the present invention is to provide for more accurate timing models. Yet another alternate or additional object of the present invention is to provide clock-context independent timing analysis. Still a further alternate or additional object of the present invention is to provide models of an actual circuit which can be generated each time without needed to be stored on a memory medium, such as a disk. These and other objects and advantages are described further in the figures, specification and claims.

An embodiment of the present invention provides a method for generating a model for a circuit having logic components comprising the steps of:

identifying the interface path logic components of the logic components so as to define shell logic components;

identifying any of the logic components apart from the shell logic components on which a constraint has been annotated so as to define constrained logic components;

determining a subset of the logic components to preserve, the subset including the shell logic and the constrained logic components; and forming the model from the subset of preserved logic components.

An embodiment of the present invention also provides a method for generating a pruned netlist for use as a timing model for a circuit comprising the steps of:

identifying logic components for an interface path of the circuit so as to define shell logic;

identifying a slowest path and a fastest path between pairs of flip-flops of the logic components so as to define dominant paths, components in the dominant paths being defined as dominant path logic components;

determining a subset of the logic components to preserve, the subset including the shell logic and the dominant logic components; and constructing a netlist representation of the subset so as to define the pruned netlist.

Advantageously, the pruned netlist need not be stored, but may be generated each time the model is needed, in other words on-the-fly. An embodiment of the present invention thus also provides a method for repeatedly generating a model for a circuit having logic components comprising the steps of:

a) identifying the interface path logic components of the logic components so as to define shell logic components;
b) determining a subset of the logic components to preserve, the subset including the shell logic;
c) forming the model from the subset of preserved logic components;
d) using the model for a particular analysis;
e) discarding the model; and
f) repeating steps a) through c) at a later point in time to form a regenerated model.

In addition to the methods described above, an embodiment of the present invention also provides a system for modeling a circuit having logic components comprising: at least one model including a reduced set of the logic components, the reduced set of logic components including shell logic and constrained logic components, the constrained logic components including any logic components having annotated constraints. An embodiment of the present invention also provides computer executable steps to perform the methods described above.

BRIEF DESCRIPTION OF THE DRAWINGS

The present invention will be better understood with respect to an example showing the modeling of a simplified circuit block, as shown in the following figures, and with respect to a system for modeling a circuit, in which.

DETAILED DESCRIPTION

Figure 1:
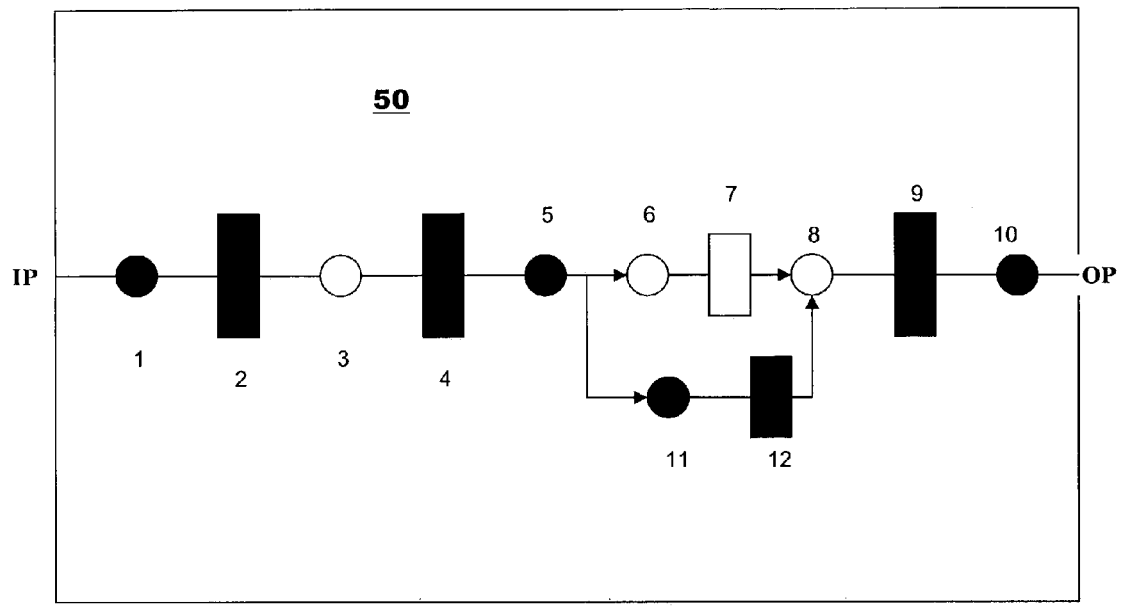
FIG. 1 shows a first logic-level circuit; with the preserved subset for the model identified by filled-in components.

FIG. 1 shows the basic concept for shell/core partitioning, in which logic components (with inputs on the left side and outputs on the right) for an interface path are identified and defined as shell logic. An approach to this partitioning is described in more detail in U.S. patent application Ser. No. 09/678,150, entitled "A TIMING VERIFICATION METHOD EMPLOYING DYNAMIC ABSTRACTION IN CORE/SHELL PARTITIONING", filed Oct. 3, 2000 and hereby incorporated by reference herein.

A representative block 50, which is a logic-level block, is created, for example, by synthesizing the register transfer or RTL level of the circuit designed by a designer using, for example, Verilog or VHDL. The designer adds any preliminary constraints to the block.

The block 50 has a single input IP, memory elements 2, 4, 7, 9 and 12, gates 1, 3, 5, 6, 8, 10 and 11, and an output pin OP. The memory elements 2, 4, 7, 9 and 12, may be, for example edge triggered D-type flip-flops, and all run on a single clock for block 50. The gates may be, for example, AND, NAND and OR gates.

Since pin I leads to memory elements 2 through gate 1, both gate 1 and memory element 2 are identified as shell logic. Since pin OP is connected to memory element 9 through gate 10, both gate 10 and memory element 9 are also identified as shell logic.

Apart from the shell logic, it is possible that a constraint has been applied on the interior logic, i.e. annotated, by the designer, for example indicating that paths through gates 5 and 11 are multi cycle (for example 2 cycles instead of one).

These constraints in general may be any assertions or exceptions, and may apply to a specific component or element of the model, for example a gate, a pin, or a memory element, or to a specific path.

Thus, in a second step, gates 5 and 11 are identified as constrained logic. The shell logic components 1, 2, 9 and 10 and these components 5 and 11 then for a subset of the logic being defined together as preserved logic.

In addition, it is possible to identify a dominant path for the multicycle relationship, which in this case is between components 4 and 12, so that components 4 and 12 are added to the preserved logic. This assumes there are no other multicycle paths between the flip-flops. If there were another dominant path, flip-flops 4 and 12 would not be preserved, unless they were part of the other dominant path. If no interior logic elements have constraints, only the shell logic is preserved.

The model thus is a pruned netlist containing the shell logic and constrained logic. By providing a pruned netlist with both shell logic and constrained logic components, the global interface, constraints of the actual circuit, as well as any annotated local restraints, can be preserved directly in the model while still reducing the amount of computational time or memory required for analysis of the actual design. When the pruned netlist is generated, input and output pins connected to the preserved logic may be included in the model to account for loading effects.

If clock context independence is not required, no further delay calculation or timing analysis is required and the timing model is used directly.

Figure 2:
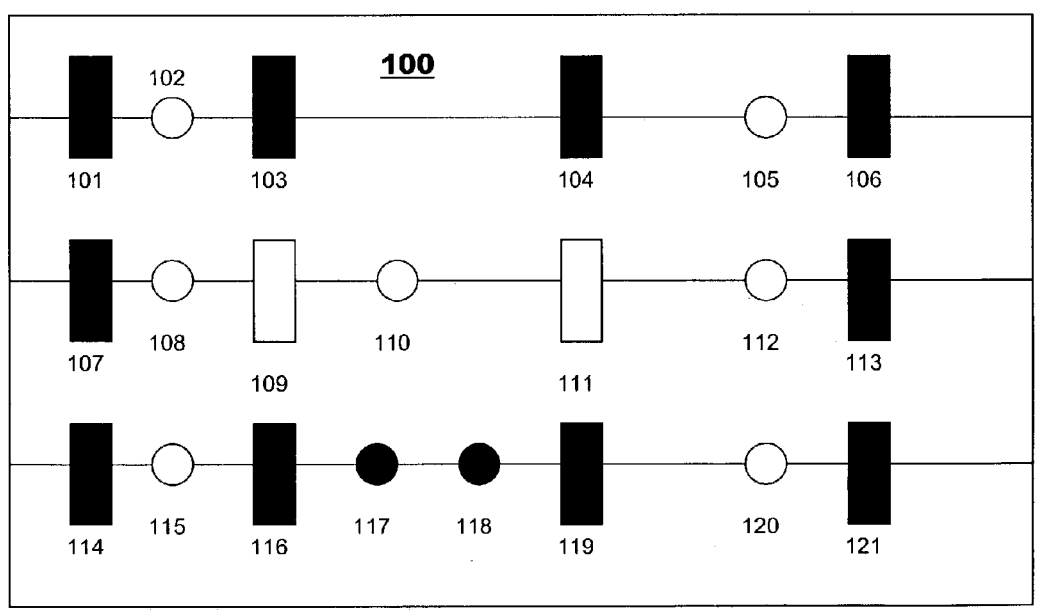
FIG. 2 shows a second logic level circuit, with the preserved subset for the model identified by filled-in components.

However, the model may be made clock-context independent by identifying still further logic components by performing delay calculations or a timing analysis of the circuit, as described in FIG. 2. This is especially useful when the circuit is primarily flip-flop based as opposed to latch-based.

A parasitics network for the preserved logic also may be included, and advantageously is simply a subset of the parasitics network for the actual circuit.

FIG. 2 is shown to further demonstrate preserving dominant time paths, and describes a block 100 with components 101, 102, 103, 104, 105, 106 between a first input and a first output, components 107, 108, 109, 110, 111, 112 and 113 between a second input and second output, and components 114, 115, 116, 117, 118, 119, 120 and 121 between a third input and a third output.

Assuming all gates 102, 105, 108, 110, 112, 115, 117, 118 and 120 have the same delay, and that all the flip-flops 101,

103, 104, 106, 107, 109, 111, 113, 114, 116, 119 and 121 are triggered by a rising edge of a same clock, then the path with flip-flops 103 and 104 is the dominant fast path and the path with flip-flop 116, gates 117 and 118 and flip-flop 119 is the dominant slow path.

Components 101, 107, 114, 106, 113 and 121 are the shell logic, the dominant fast path components 103, 104 and dominant slow path components, 116, 117, 118 and 119 are added to the constrained logic (here none) so that components 102, 105, 108, 109, 110, 111, 112, 115 and 120 are pruned.

The identification of the slowest path and fastest path (the dominant paths) may be performed for all pairs of active clock edges, both trailing and leading, for every clock input port. Each active clock edge may be considered sequentially as a launching edge, and paths from the launching edge to every capturing edge are analyzed to determine the fastest and slowest path between the launching and capturing pair. During the analysis, the arrival time of a clock edge at the primary input port is assumed to be zero.

Logic apart from the shell logic and/or dominant path logic may also be added to the subset.

The dominant paths thus provide constraints on the timing between corresponding clock edges in the waveforms provided to the block.

During this analysis, level-sensitive latches may be treated as closed. However, paths to and from latches are not considered in choosing the dominant paths, since the analysis is performed preferably between flip-flops.

In some cases, varying input slew at the clock input ports can cause, especially with reconvergent logic and monotonically decreasing delay models, the fastest and slowest paths to vary. The present invention thus preferably can also analyze worst case interactions as a function of the fastest and slowest input slews at each clock input port. This slew range can be preserved in the model as an additional constraint.

In order to handle latches present in the logic, one of three additional latch-based modeling methods may be employed, as will be described with respect to FIG. 3.

In the first latch based modeling method, all logic reachable from each latch is preserved. This provides accurate modeling of all paths with latches.

In the second latch-based modeling method, the fastest and slowest paths are identified for each latch pair, and the logic associated with those paths is preserved in the model. This analysis however is computationally or memory intensive, in that either a depth-first or breadth-first analysis to and from each latch is required.

In the third latch-based modeling method, a dominant subset of paths between and through latches is identified for the fastest and slowest paths between every pair of latches for each 0, 1, . . . X levels of the latches reachable from the circuit's input ports and output ports, where X is a number specified by the model user. This ensures that borrowing through the specified number of levels is accurately modeled. The resultant model with this technique is not clock-context independent.

Figure 3:
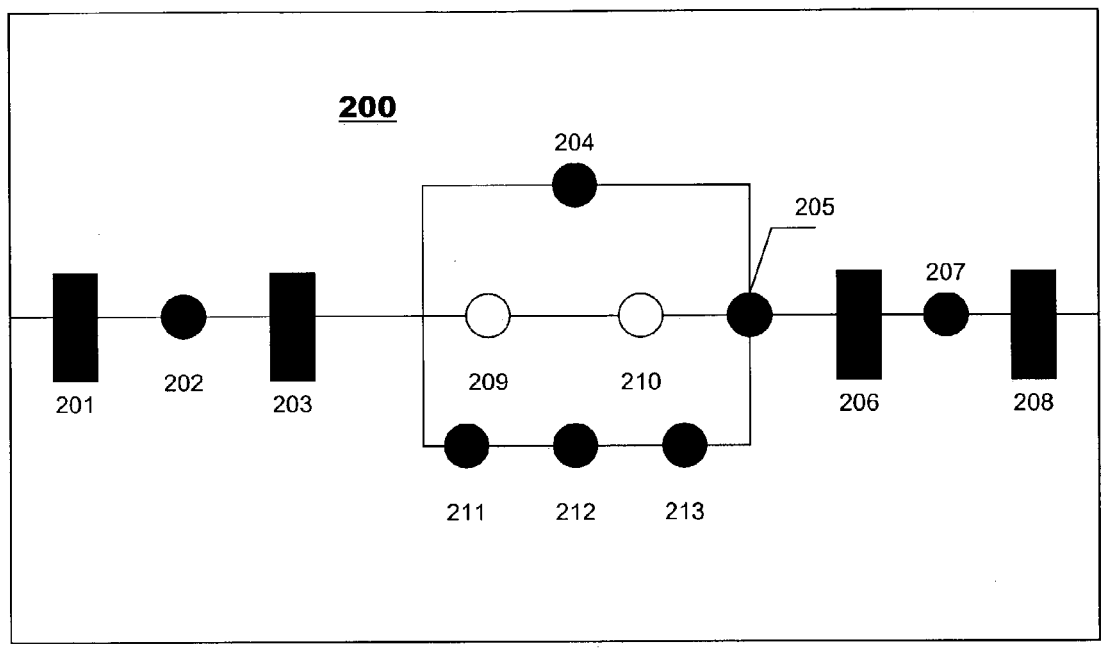
FIG. 3 shows a third logic-level circuit in which latch paths are preserved and the preserved subset identified by filled-in components.

FIG. 3 shows a circuit 200 for describing the first two latch-based methods described above, in which it is assumed that the components 201, 203, 206 and 208 are latches gated by a same clock.

The circuit 200 thus has components 201, 202, 203, 204, 209, 210, 211, 212, 213, 205, 206, 207 and 208 as shown.

For the first latch-based method, all logic reachable from each latch 201, 203, 206, 208 is preserved, so that in this case all components are preserved.

In the second latch-based modeling method, the fastest and slowest paths are identified for each latch pair 201/203, 203/206, and 206/208. The logic associated with those paths is preserved in the model. Assuming gates 204, 209, 210, 211, 212 and 213 all have the same delay, the path through gate 204 is fastest and through gates 211, 212 and 213 slowest, so the model will prune gates 209 and 210. All other components 201, 202, 203, 204, 205, 206, 207, 208, 211, 212 and 213 are preserved.

Figure 4:
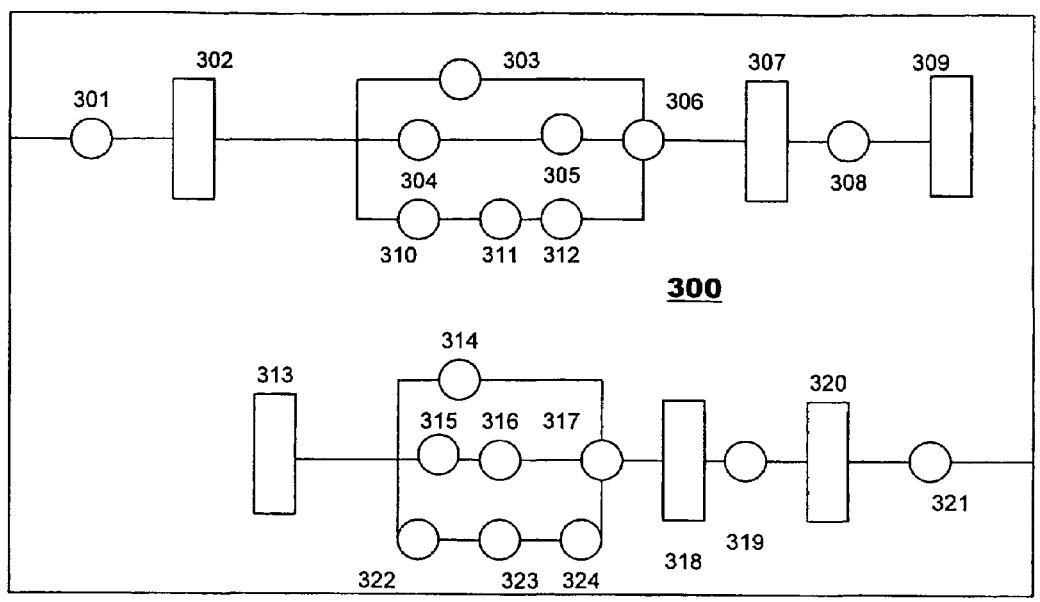
FIG. 4 shows a fourth logic-level circuit in which latch paths are also preserved.

In the third latch-based modeling method, demonstrated using FIG. 4 but without filling for preserved components, a dominant subset of paths between and through latches is identified for the fastest and slowest paths between every pair of latches for each 0, 1, . . . X levels of the latches reachable from the circuit's input and output ports, where X is a number specified by the model user.

Assuming components 302 and 307 are latches gated by a same clock, and 309 is a flip-flop gated by that clock, zero or more of 302 and 307 may be open when the data signal arrives, allowing time-borrowing through the latch. Similarly, assuming components 318 and 320 are latches gated by a same clock and 313 is a flip-flop gated by that clock, zero or more of 318 and 320 may be open when the data signal arrives, allowing time-borrowing through the latch.

If a zero level is specified, the model does not provide for any time-borrowing, and only the shell logic will preserved in the model. In this case, components 301, 302, 320, and 321 are preserved.

If a single level is specified, both the shell logic and the dominant paths between the first and second levels of latches are preserved in the model. In this case, the fastest and slowest paths are identified for the latch pair 302/307. Assuming gates 303, 304, 305, 306, 310, 311, and 312 have a same delay, the path through 303 is fastest and through gates 310, 311, and 312 slowest. Similarly, the fastest and slowest paths are identified for the latch pair, 318/320, which both go through gate 319. Thus components 301, 302, 303, 306, 307, 310, 311, 312, 318, 319, 320, and 321 are preserved.

If two levels are used, the shell logic, the dominant paths between the first and second levels of latches, and the dominant paths between the second and third levels of latches are preserved in the model. The fastest and slowest paths are identified for the latch pair 307/309, which both go through gate 308. Similarly, the fastest and slowest paths are identified for the latch pair 313/318. Assuming gates 314, 315, 316, 317, 322, 323, and 324 all have a same delay, the path through 314 is fastest, and through gates 322, 323, and 324 slowest. Thus components 301, 302, 303, 306, 310, 311, 312, 307, 308, 309, 313, 314, 317, 318, 319, 320, 321, 322, 323, and 324 are preserved.

Figure 5:
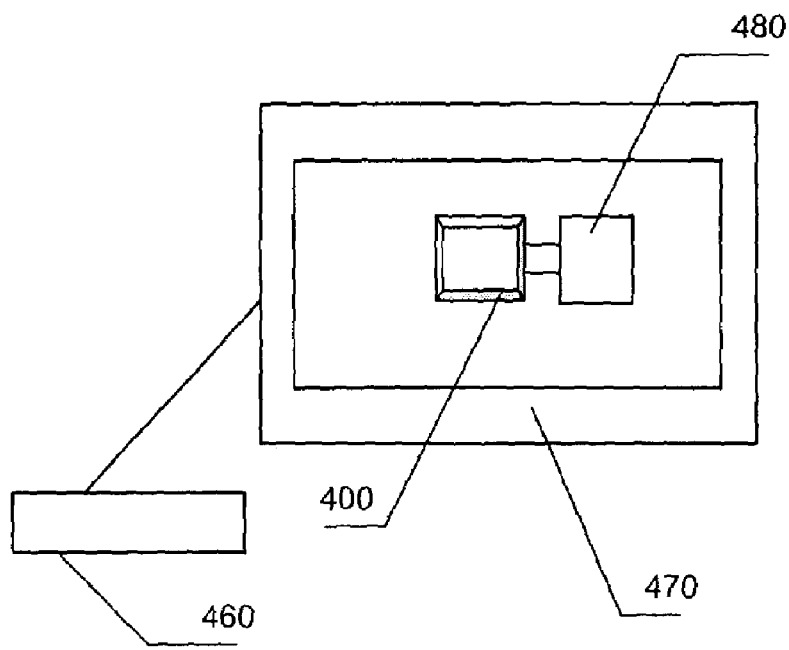
FIG. 5 shows a system for use with models of the present invention.

FIG. 5 shows an example of a processor-based system, using a model 400, which is stored as a file in persistent storage 460, for example. The model block 400 may be represented in graphical form on a display or GUI of a processor 470. A double-line, for example, or any other indication including coloring, can represent that block 400 is model. An actual circuit 480 not yet modeled can be connected to the model. Placement and routing and delay calculations, for example, can thus be performed by the designer in building an entire circuit from blocks 400 and 480 (and others), with model 400 providing both memory and processing time advantages. The timing analysis model for the circuit remains highly accurate.

In a preferred embodiment, the resultant model has varying delays based on boundary conditions of the input slew and output loading characteristics, i.e. for a fastest and slowest input slew and for a highest and lowest output loading. In this case parasitics, e.g., interconnect wire resistance and capacitance, are included with the logic model. For nets that connect to module ports or internal pins on hierarchy boundaries, a detailed parasitics network is provided for stitching purposes, i.e. each detailed parasitics network in the model is merged with the detailed parasitics network for the corresponding external net.

By providing parasitics for the model, the model becomes fully context independent with respect to boundary condition changes, and current methods for relating parasitics to an entire circuit can be used in just the same way for relating the parasitics to the model.

However, for a specific known implementation of the circuit, the model can be used to generate a model with fixed delays by performing the delay calculation prior to constructing the pruned netlist representation. The delays in each timing arc, e.g. from each input pin to each output pin, are added to the model as delay assertions or constraints. In this case, no parasitics need be added to the model, since the delays are known for a specific set of boundary conditions for that implementation.

For a planned or budgeted implementation, fixed delays can be generated by converting high-level interface budgets and clock waveform relationships into delay budgets for each timing arc in the original circuit. These delays are then treated as actual delays. The delay budgets on each timing arc in the pruned netlist are added to the model as delay assertions, and no parasitics are included.

In modeling the circuit with clock context independence, if a different clock frequency is to be used than the original one used for determining the most constraining flip-flop pair, the most constraining constraint may be altered accordingly, so that if a clock at twice the frequency of the original is used for a circuit design, the time constraint may be halved. Clock context independence thus is provided.

The model may be used and discarded after each use. Intentionally discarding the model ensures consistency between the original circuit and the model and simplifies managing the data for the circuit.

Preferably, the formed model is not stored in persistent storage, and is regenerated only as needed.

However, once the pruned netlist model has been constructed, and any parasitics or delay assertions are added to the netlist to define a shell timing model, it may be stored to persistent storage, for example as a single file.

This file can then be read into memory when performing timing analysis on a larger design containing the original circuit, and the model is bound into the design in place of the original circuit. For most analyses (although not for implementation tasks), the model provides a highly accurate representation of the original circuit while still significantly reducing computational and/or memory requirements.

The model can be identified as such to the user when performing analysis to prevent confusion with the original circuit.

The present embodiment provides for minimal or no loss of accuracy in a delay calculation and timing analysis of the model compared to a full circuit, and the timing analysis reports provide the same level of detail with the model as with the full circuit.

Since the structure of the relevant interface logic remains in the model, budgeting algorithms that analyze the implementation flexibility of the interface logic can be run on the model. False path elimination and other sensitization algorithms can also be run.

Unlike black and gray box models, there is no need to run multiple passes of delay calculation and timing analysis on the logic.

A memory element as used herein may include a flip-flop, level-sensitive latch or RAM/ROM element.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

What is claimed is:

1. A method for generating a model for a circuit having logic components comprising the steps of:
   identifying interface path logic components of the logic components so as to define interface logic;
   identifying any logic components apart from the interface logic on which a constraint has been annotated so as to define constrained logic components;
   determining a subset of the logic components to be preserved, the subset including the interface logic and the constrained logic components so as to define preserved logic; and
   forming the model from the preserved logic.

2. The method as recited in claim 1 wherein the constraint on the constrained logic components is a timing constraint.

3. The method as recited in claim 1 wherein the constraint is on an individual component of the circuit.

4. The method as recited in claim 1 wherein the constraint is on a path in the circuit.

5. The method as recited in claim 1 further comprising storing the model to persistent storage.

6. The method as recited in claim 1 wherein the logic components include a plurality of flip flops, and further comprising applying a timing analysis between the plurality of flip-flops so as to determine a slowest path between two of the plurality of flip-flops for a certain clock.

7. The method as recited in claim 6 further comprising determining a fastest path between two of the plurality of flip-flops.

8. The method as recited in claim 6 wherein the timing analysis includes determining the slowest path for a slowest input slew at a clock input and for a fastest input slew at the clock input.

9. The method as recited in claim 1 further comprising identifying latch-based information to add to the model.

10. The method as recited in claim 9 wherein the identifying step includes adding all logic components connected to latches in the circuit to the constrained logic components.

11. The method as recited in claim 9 wherein the identifying step includes identifying fastest and slowest paths between latch pairs of the logic components.

12. The method as recited in claim 9 wherein the identifying step includes identifying timing constraints on a subset of paths between and through latches through a plurality of levels of the latches.

13. The method as recited in claim 1 further comprising adding information to the model to identify the model as a circuit block model.

14. The method as recited in claim 13 further comprising providing identification of the model as the circuit block model on a screen.

15. The method as recited in claim 1 further comprising adding input and output pins connected to the preserved logic to the model.

16. The method as recited in claim 1 further comprising adding parasitics for the preserved logic to the model.

17. The method as recited in claim 1 further comprising performing a delay calculation on the circuit for a specific known implementation of the circuit so as to determine a most constraining delay, and adding the most constraining delay to the model as a constraint.

18. The method as recited in claim 1 further comprising calculating a delay in a timing arc of the circuit and adding the delay to the model as a delay assertion.

19. The method as recited in claim 1 further comprising converting an interface budget into a delay budget for a timing arc in the circuit, and adding the delay budget to the model as a delay assertion.

20. The method of claim 1,
wherein the logic components include a first flip-flop and a second flip-flop, the first and second flip flop defining a fastest or slowest path for a particular clock,
wherein said step of identifying any logic components comprises identifying the slowest path and the fastest path between pairs of flip-flops of the logic components so as to define dominant paths, components in the dominant paths being defined as dominant path logic components; and
wherein, in said step of determining a subset of the logic components to be preserved, the subset includes the interface logic and the dominant path logic components.

21. The method as recited in claim 20 further comprising identifying any logic components apart from the shell logic and/or dominant path logic on which a constraint has been annotated so as to define constrained logic components, and adding the constrained logic components to the subset.

22. The method as recited in claim 20 wherein the determining of the slowest path and fastest path is performed for all active clock edges for every clock input port.

23. The method as recited in claim 20 wherein during determining the slowest path and fastest path all latches of the circuit are treated as closed.

24. A system for modeling a circuit having logic components comprising:
at least one model generated by a method comprising the steps of:
identifying interface path logic components of the logic components so as to define interface logic,
identifying any logic components apart from the interface logic on which a constraint has been annotated so as to define constrained logic components,
determining a subset of the logic components to be preserved, the subset including the interface logic and the constrained logic components so as to define preserved logic, and
forming the model from the preserved logic,
said model including a reduced set of the logic components, the reduced set of logic components including shell logic and constrained logic components, the constrained logic components including any logic components having annotated constraints.

25. The system as recited in claim 24 wherein the logic components include a first flip-flop and a second flip-flop, the first and second flip flop defining a fastest or slowest path for a particular clock.

26. Computer executable process steps operative to control a computer, stored on a computer-readable medium for facilitating generation of a timing model for a circuit having logic components, the process steps comprising:
identifying the interface path logic components of the logic components so as to define interface logic;
identifying any of the logic components apart from the interface logic on which a constraint has been annotated so as to define constrained logic components;
determining a subset of the logic components to be preserved, the subset including the interface logic and the constrained logic components so as to define preserved logic; and
forming the model from the preserved logic.

27. Computer executable process steps according to claim 26,
wherein the logic components include a first flip-flop and a second flip-flop, the first and second flip flop defining a fastest or slowest path for a particular clock,
wherein said step of identifying any logic components comprises identifying a the slowest path and the fastest path between pairs of flip-flops of the logic components so as to define dominant paths, components in the dominant paths being defined as dominant path logic components; and
wherein, in said step of determining a subset of the logic components to be preserved, the subset includes the interface logic and the dominant path logic components.

28. A method for repeatedly generating a model for a circuit having logic components comprising the steps of:
a) identifying the interface path logic components of the logic components so as to define interface logic components;
b) determining a subset of the logic components to be preserved, the subset including the interface logic;
c) forming the model from the subset of preserved logic components;
d) using the model for a particular analysis;
e) discarding the model; and
f) repeating steps a) through c) at a later point in time to form a regenerated model.

29. The method as recited in claim 28 wherein the formed model is not stored in persistent storage.

30. Computer executable process steps operative to control a computer, stored on a computer-readable medium for facilitating multiple generation of a timing model for a circuit having logic components, the process steps comprising:
a) identifying the interface path logic components of the logic components so as to define interface logic components;
b) determining a subset of the logic components to be preserved, the subset including the interface logic;
c) forming the model from the subset of preserved logic components;
d) using the model for a particular analysis;
e) discarding the model; and
f) repeating steps a) through c) at a later point in time to form a regenerated model.

* * * * *